United States Patent
Wang et al.

(10) Patent No.: US 10,651,420 B2
(45) Date of Patent: May 12, 2020

(54) DISPLAY DEVICE HAVING GROOVES FORMED IN AN INSULATION LAYER AND METHOD FOR ENCAPSULATING SAME

(71) Applicant: BOE TECHNOLOGY GROUP CO., LTD., Beijing (CN)

(72) Inventors: Youwei Wang, Beijing (CN); Song Zhang, Beijing (CN); Ping Song, Beijing (CN); Peng Cai, Beijing (CN); Yuanzheng Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/094,366

(22) PCT Filed: Feb. 5, 2018

(86) PCT No.: PCT/CN2018/075240
§ 371 (c)(1),
(2) Date: Oct. 17, 2018

(87) PCT Pub. No.: WO2019/019603
PCT Pub. Date: Jan. 31, 2019

(65) Prior Publication Data
US 2019/0348632 A1    Nov. 14, 2019

(30) Foreign Application Priority Data
Jul. 27, 2017  (CN) .......................... 2017 1 0624574

(51) Int. Cl.
*H01L 29/08*       (2006.01)
*H01L 33/00*       (2010.01)
(Continued)

(52) U.S. Cl.
CPC ...... *H01L 51/5253* (2013.01); *H01L 27/3244* (2013.01); *H01L 27/3258* (2013.01)

(58) Field of Classification Search
CPC ............. H01L 51/5253; H01L 27/3244; H01L 27/3258
See application file for complete search history.

(56) References Cited

U.S. PATENT DOCUMENTS 7,671,532 B2 *   3/2010   Kim .................... H01L 51/5246
                                                    313/509
7,956,355 B2 *   6/2011   Hayashi .............. H01L 51/5237
                                                    257/100
(Continued)

FOREIGN PATENT DOCUMENTS

CN           1710999 A       12/2005
CN         203883009 A       10/2014
(Continued)

OTHER PUBLICATIONS

International Search Report and Written Opinion dated May 9, 2018.

*Primary Examiner* — Alonzo Chambliss
(74) *Attorney, Agent, or Firm* — Dilworth & Barrese, LLP.; Michael J. Musella, Esq.

(57) ABSTRACT

A display device and a method for encapsulating the same are disclosed. A display device includes: a base substrate, an insulation layer disposed on the base substrate, an organic light emitting component disposed on the insulation layer, and an encapsulation layer configured for sealing the organic light emitting component. The insulation layer includes an encapsulation region, the insulation layer and the encapsulation layer are in contact with each other in the encapsulation region, and at least one cutting groove is formed in a contact region.

16 Claims, 2 Drawing Sheets

(51) Int. Cl.
  *H01L 31/0203*    (2014.01)
  *H01L 21/00*      (2006.01)
  *H01L 51/52*      (2006.01)
  *H01L 27/32*      (2006.01)

(56) References Cited

U.S. PATENT DOCUMENTS

| | | | |
|---|---|---|---|
| 9,685,626 B2* | 6/2017 | Kim | H01L 51/5237 |
| 10,319,938 B2* | 6/2019 | Choi | H01L 27/124 |
| 10,326,099 B2* | 6/2019 | Kim | H01L 51/5237 |
| 2003/0062533 A1* | 4/2003 | Yee | H01L 51/524 |
| | | | 257/99 |
| 2005/0285522 A1 | 12/2005 | Han et al. | |
| 2016/0365395 A1 | 12/2016 | Xu et al. | |

FOREIGN PATENT DOCUMENTS

| | | |
|---|---|---|
| CN | 104900681 A | 9/2015 |
| CN | 105810710 A | 7/2016 |
| CN | 106206959 A | 12/2016 |
| CN | 205985076 A | 2/2017 |
| CN | 106784376 A | 5/2017 |
| CN | 106935728 A | 7/2017 |
| CN | 106981584 A | 7/2017 |
| CN | 107359275 A | 11/2017 |

\* cited by examiner

DISPLAY DEVICE HAVING GROOVES FORMED IN AN INSULATION LAYER AND METHOD FOR ENCAPSULATING SAME

CROSS-REFERENCE OF RELATED APPLICATION

The present application claims the priority of Chinese patent application No. 201710624574.X filed on Jul. 27, 2017, the disclosure of which is hereby incorporated by reference herein in its entirety.

TECHNICAL FIELD

Embodiments of the present disclosure relate to a display device and a method for encapsulating the same.

BACKGROUND

An organic light emitting component in a display device is less tolerant to the surrounding environment, and in conventional technology, the thin film encapsulating method is used to isolate an organic light emitting component from the external environment with an encapsulation layer.

While the organic light emitting component is encapsulated, the encapsulation layer is bonded to the organic light emitting component. Since the bonding region between the encapsulation layer and a bulk substrate is unstable, the cutting portion is liable to crack when the bulk substrate is cut, so that the moisture would enter the encapsulation layer, causing the damage to the organic light emitting component, and resulting in encapsulating failures.

SUMMARY

Embodiments of the present disclosure provide a display device and a method for encapsulating the same. By disposing a cutting groove in a contact region between an insulation layer and an encapsulation layer, the overall encapsulating yield is effectively increased, and the service life of the organic light emitting component is prolonged.

In the first aspect of the present disclosure, it is provided a display device, which comprises: a base substrate, an insulation layer disposed on the base substrate, an organic light emitting component disposed on the insulation layer, and an encapsulation layer configured for sealing the organic light emitting component, wherein the insulation layer comprises an encapsulation region, the insulation layer and the encapsulation layer are in contact with each other in the encapsulation region, and at least one cutting groove is formed in a contact region.

In the second aspect of the present disclosure, it is provided a method for encapsulating a display device, comprising: forming an insulation layer and an organic light emitting component sequentially on a base substrate, wherein the organic light emitting component is disposed on the insulation layer, and the insulation layer comprises an encapsulation region and a cutting region; forming at least one cutting groove in the encapsulation region of the insulation layer; and sealing the organic light emitting component with an encapsulation layer, such that the insulation layer and the encapsulation layer are in contact with each other in the encapsulation region, and the at least one cutting groove is disposed in a contact region.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
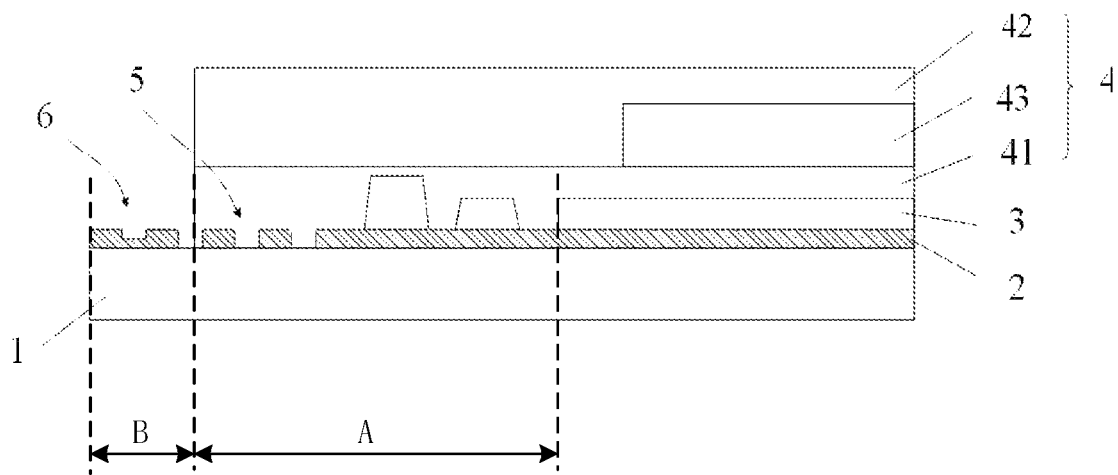
FIG. 1 schematically illustrates a cross-section view of a display device according to an embodiment of the present disclosure.
Figure 2:
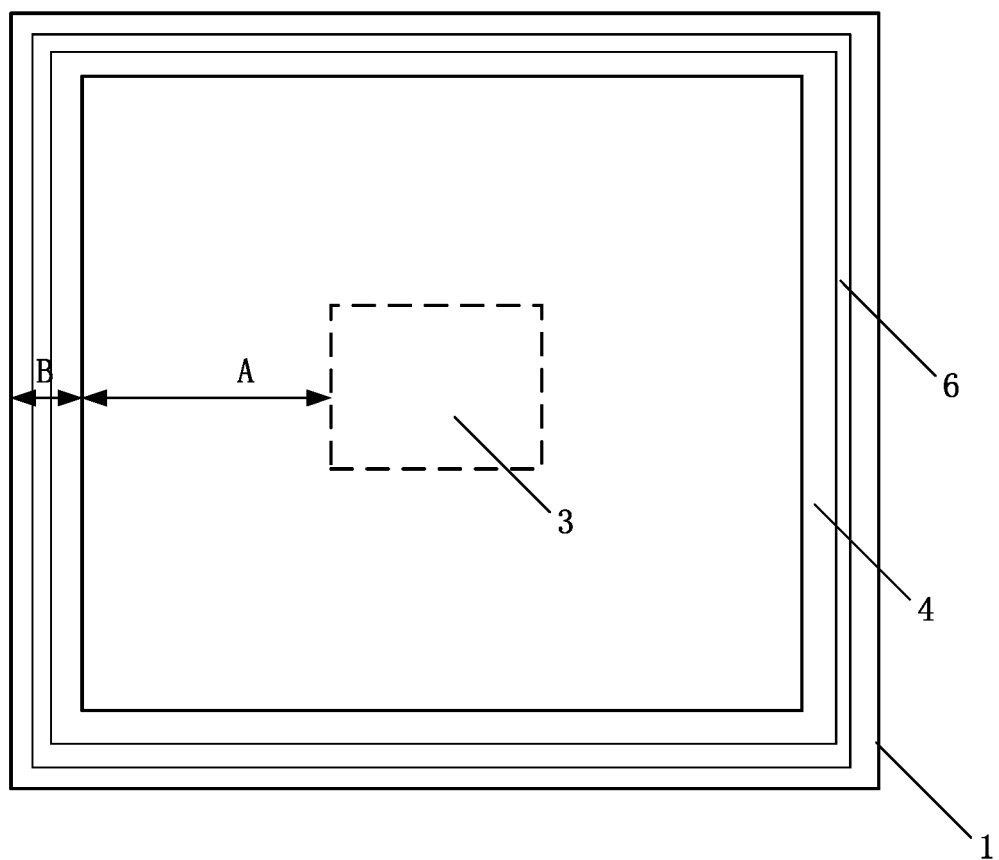
FIG. 2 schematically illustrates a top view of a display device according to an embodiment of the present disclosure.

As illustrated in FIG. 1 to FIG. 2, an embodiment of the present disclosure provides a display device, which comprises: a base substrate 1, an insulation layer 2 disposed on the base substrate 1, an organic light emitting component 3 disposed on the insulation layer 2, and an encapsulation layer 4 configured for sealing the organic light emitting component 3. Herein, the insulation layer 2 comprises an encapsulation region A, the insulation layer 2 and the encapsulation layer 4 contact with each other in the encapsulation region A, and at least one cutting groove 5 is formed in a contact region. As illustrated in FIG. 2, the insulation layer 2 comprises an encapsulation region A and a cutting region B. Herein, the encapsulation region A surrounds a periphery of the organic light emitting component 3, the cutting region B surrounds a periphery of the encapsulation region A. The cutting region B and the encapsulation region A are adjacent to each other.

In the above display device, the insulation layer 2 and the encapsulation layer 4 are provided with cutting grooves 5 in the encapsulation region A, which prolongs the path of the moisture entering the organic light emitting component 3 after entering the encapsulation region A, thus, the encapsulating effect of the encapsulation layer 4 is increased, the probability of moisture entering the encapsulation layer 4 is reduced effectively, the overall encapsulating yield is increased, the service life of the organic light emitting component 3 is increased, and the service life of the above display device is further increased.

In at least some embodiments, at least one cutting groove 5 is a through groove penetrating through the insulation layer 2 and near the organic light emitting component 3. For example, a depth of the through groove is the same as a thickness of the insulation layer 2. A cross-section shape of the through groove 5 may be any shape, such as a rectangle, a trapezoid or the like. As illustrated in FIG. 2, the through groove 5 surrounds the periphery of the organic light emitting component 3, and a closed loop is formed in the encapsulation region A. In other embodiments, the through groove 5 may surround the organic light emitting component 3 in a discontinuous manner.

While cutting the bulk substrate, the cracks generated by the cutting can be effectively prevented from extending into the encapsulation region by providing the through grooves, because the extension of the cracks can be terminated by the through grooves, and the external moisture can be effectively prevented from entering the organic light emitting component 3, thus the encapsulating effect of the encapsulation layer 4 and the service life of the organic light emitting component 3 are increased. A certain amount of moisture may be accommodated in a cavity of the through groove, which can decrease the rate and quantity of moisture flowing into the organic light emitting component 3, and therefore, it acts as a barrier to the external moisture.

In at least some embodiments, the encapsulation layer 4 comprises a first inorganic layer 41 and a second inorganic layer 42, and an organic buffer layer 43 is disposed between the first inorganic layer 41 and the second inorganic layer 42.

Most of the external moisture can be blocked by the first inorganic layer 41 and the second inorganic layer 42, thus the encapsulating effect of the encapsulation layer 4 on the organic light emitting component 3 is increased. Further, the organic buffer layer 43 is disposed between the first inorganic layer 41 and the second inorganic layer 42, in order to ensure that the encapsulation layer 4 is leveled while the external moisture is blocked. A structure with the first inorganic layer 41, the organic buffer layer 43 and the second inorganic layer 42 is used in the encapsulation layer 4, thus the encapsulating effect of the encapsulation layer 4 is effectively increased, the moisture is prevented from entering the organic light emitting component 3, and the service life of the organic light emitting component is increased.

For example, the first inorganic layer 41 is closer to the organic light emitting component 3 than the second inorganic layer 42, and the first inorganic layer 41 is in contact with the insulation layer 2 in the encapsulation region A.

For example, a material of the first inorganic layer 41 is the same as that of the insulation layer 2, thus the bonding force between the encapsulation layer 4 and the insulation layer 2 is enhanced, the stability of the encapsulation layer 4 is increased, and the encapsulation layer 4 is effectively prevented from crack while being cut or bent.

Figure 3:
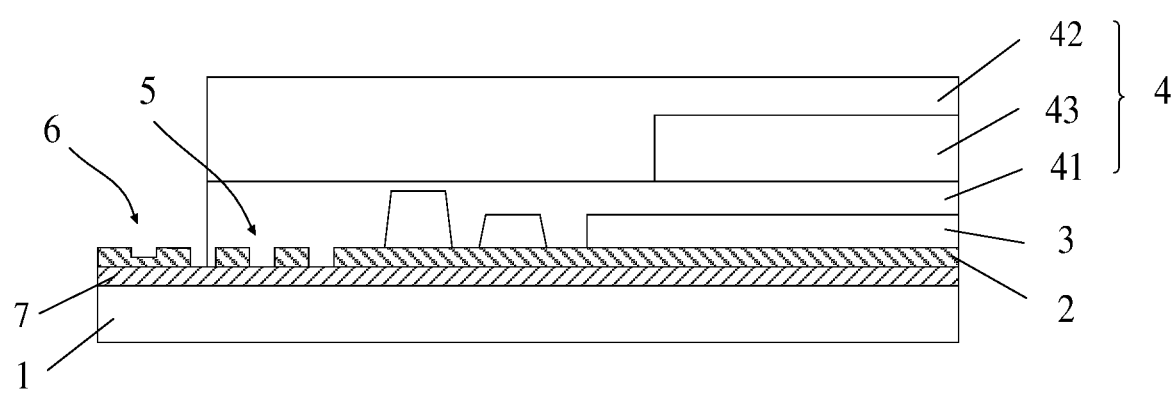
FIG. 3 schematically illustrates a cross-section view of another display device according to an embodiment of the present disclosure.
Figure 4:
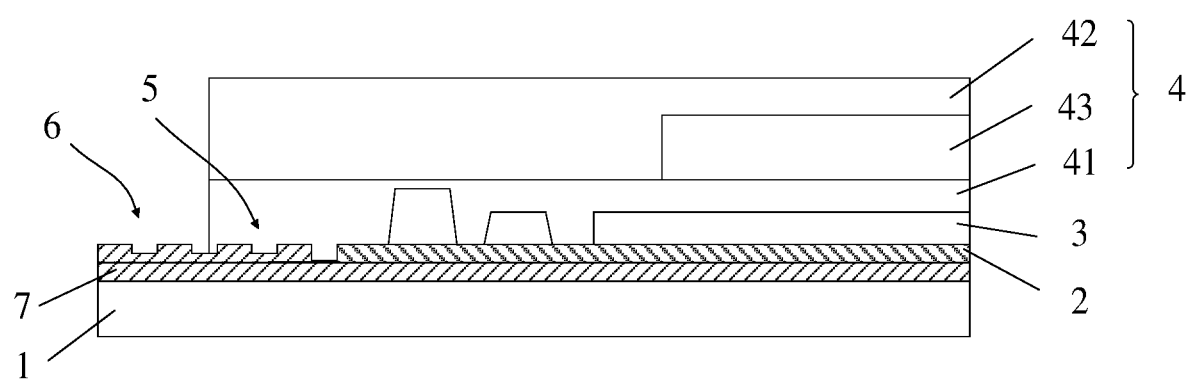
FIG. 4 schematically illustrates a cross-section view of still another display device according to an embodiment of the present disclosure.

In at least some embodiments, a buffer layer 7 is disposed between the base substrate 1 and the insulation layer 2, as illustrated in FIGS. 3 and 4.

The buffer layer 7 is disposed between the base substrate 1 and the insulation layer 2, so that the bonding between the base substrate 1 and the insulation layer 2 is more stable.

As illustrated in FIGS. 1, 3 and 4, the cutting region comprises at least one first cutting groove (e.g., the through groove 5) whose depth is the same as the thickness of the insulation layer 2, and at least one second cutting groove 6 whose depth is smaller than the thickness of the insulation layer 2.

In case that at least one first cutting groove 5 is disposed at a boundary between the cutting region B and the encapsulation region A, the encapsulation layer 4 is extended laterally and is terminated in the first cutting groove 5, as illustrated in FIGS. 1 and 3.

In case that at least one second cutting groove 6 is disposed at the boundary between the cutting region B and the encapsulation region A, the encapsulation layer 4 is extended laterally and is terminated in the second cutting groove 6, as illustrated in FIG. 4.

As illustrated in FIG. 3, an edge of the first inorganic layer 41 is bonded with the buffer layer 7, meanwhile, the material of the first inorganic layer 41 is the same as that of the buffer layer 7, then the bonding stability of the encapsulation layer 4 is increased, and the encapsulating effect on the organic light emitting component 3 is increased.

As illustrated in FIG. 4, the edge of the first inorganic layer 41 is bonded with the insulation layer 2, meanwhile, the material of the first inorganic layer 41 is the same as that of the insulation layer 2, then the bonding stability of the encapsulation layer 4 is increased, and the encapsulating effect on the organic light emitting component 3 is increased. In the second cutting groove 6, the edge of the first inorganic layer 41 is bonded with an inner wall of the second cutting groove 6, then the bonding stability of the encapsulation layer 4 is further increased, and the encapsulating effect on the organic light emitting component 3 is increased.

In at least some embodiments, the material of the first inorganic layer 41 is silicon nitride or silicon oxynitride.

Since both silicon nitride and silicon oxynitride have excellent water repellency, the external moisture, oxygen and corrosive substances are effectively blocked, then the organic light emitting component 3 is protected from corrosion, and the service life of the organic light emitting component is increased.

In at least some embodiments, a distance from the cutting region B to the organic light emitting component 3 is greater than zero and less than or equal to 80 μm. Or, the distance from the boundary between the cutting region B and the encapsulation region A to the organic light emitting component 3 is greater than zero and less than or equal to 80 μm.

In the above embodiment, since the cutting groove is disposed in the contact region between the encapsulation layer 4 and the insulation layer 2, the path of the external moisture entering the organic light emitting component 3 is effectively prolonged. When the encapsulation layer 4 is extended into the cutting region B, the crack of the encapsulation layer 4 can be avoided while cutting the insulation layer 2, furthermore, a coverage area of the encapsulation layer 4 is increased, and the distance from the edge of the encapsulation layer 4 to the organic light emitting component 3 is increased. The probability of the crack extending to the encapsulation region is reduced by providing the cutting groove 5, and a certain amount of moisture can be accommodated in the cutting groove 5, thus the difficulty and distance of moisture entering the organic light emitting component 3 is increased, and then the service life of the organic light emitting component 3 is increased.

As illustrated in FIGS. 1 and 2, another embodiment of the present disclosure provides a method for encapsulating a display device, which comprises:

forming an insulation layer 2 and an organic light emitting component 3 sequentially on a base substrate 1, the organic light emitting component 3 is disposed on the insulation layer 2, and the insulation layer 2 comprises an encapsulation region A and a cutting region B;

forming at least one cutting groove 5 in the encapsulation region A of the insulation layer 2; and sealing the organic light emitting component 3 with the encapsulation layer 4, such that the insulation layer 2 and the encapsulation layer 4 are in contact with each other in the encapsulation region A, and at least one cutting groove 5 is disposed in a contact region.

In at least some embodiments, at least one cutting groove comprises at least one first cutting groove, the at least one first cutting groove is a through groove penetrating through the insulation layer and near the organic light emitting component.

In at least some embodiments, a depth of the through groove is the same as a thickness of the insulation layer.

In at least some embodiments, the encapsulation layer comprises a first inorganic layer and a second inorganic layer, and an organic buffer layer is disposed between the first inorganic layer and the second inorganic layer.

In at least some embodiments, the first inorganic layer is closer to the organic light emitting component than the second inorganic layer, and is in contact with the insulation layer in the encapsulation region.

In at least some embodiments, at least one first cutting groove is disposed at a boundary between the encapsulation region and the cutting region of the insulation layer, the encapsulation layer is extended laterally and is terminated in the first cutting groove.

In at least some embodiments, at least one cutting groove further comprises at least one second cutting groove, and a depth of the second cutting groove is smaller than a thickness of the insulation layer.

In at least some embodiments, the at least one second cutting groove is disposed at a boundary between the encapsulation region and the cutting region of the insulation layer, the encapsulation layer is extended laterally and is terminated in the second cutting groove.

The layers, materials and arrangement manners thereof mentioned in the present embodiment, may be referred to the above embodiments, and details are not elaborated herein.

The display device mentioned in the above embodiments is, for example, a flexible display device, that is, the base substrate is made of a flexible material. The organic light emitting component comprises, for example, a plurality of organic light emitting units, and each organic light emitting unit comprises an anode, a cathode, and a light emitting layer disposed between the anode and the cathode.

In the present embodiment, since the cutting groove is disposed in the contact region between the encapsulation layer 4 and the insulation layer 2, the path of the external moisture entering the organic light emitting component 3 is effectively prolonged. When the encapsulation layer 4 is extended into the cutting region B, the crack of the encapsulation layer 4 can be avoided while cutting the insulation layer 2, furthermore, a coverage area of the encapsulation layer 4 is increased, and the distance from the edge of the encapsulation layer 4 to the organic light emitting component 3 is increased. The probability of the crack extending to the encapsulation region is reduced by providing the cutting groove 5, and a certain amount of moisture can be accommodated in the cutting groove 5, thereby the difficulty and distance of moisture entering the organic light emitting component 3 is increased, and then the service life of the organic light emitting component 3 is increased.

In the present disclosure, the following points should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. A display device, comprising:
a base substrate;
an insulation layer, disposed on the base substrate;
an organic light emitting component, disposed on the insulation layer; and
an encapsulation layer, configured for sealing the organic light emitting component,
wherein the insulation layer comprises an encapsulation region, the insulation layer and the encapsulation layer are in contact with each other in the encapsulation region, and at least one cutting groove is formed in a contact region,
wherein the at least one cutting groove comprises at least one first cutting groove, and the at least one first cutting groove is a through groove penetrating through the insulation layer and near the organic light emitting component, and
wherein a depth of the through groove is same as a thickness of the insulation layer.

2. The display device according to claim 1, wherein the encapsulation layer comprises a first inorganic layer and a second inorganic layer, and an organic buffer layer is disposed between the first inorganic layer and the second inorganic layer.

3. The display device according to claim 2, wherein the first inorganic layer is closer to the organic light emitting component than the second inorganic layer, and the first inorganic layer is in contact with the insulation layer in the encapsulation region.

4. The display device according to claim 2, wherein a material of the first inorganic layer is silicon nitride or silicon oxynitride.

5. The display device according to claim 1, wherein a buffer layer is disposed between the base substrate and the insulation layer.

6. The display device according to claim 1, wherein the insulation layer further comprises a cutting region, wherein the encapsulation region surrounds a periphery of the organic light emitting component, the cutting region surrounds a periphery of the encapsulation region, and the cutting region and the encapsulation layer are adjacent to each other.

7. The display device according to claim 1, wherein a distance from the at least one cutting groove to the organic light emitting component is greater than zero and less than or equal to 80 μm.

8. A method for encapsulating the display device of claim 1, comprising:
forming the insulation layer and the organic light emitting component sequentially on the base substrate, wherein the organic light emitting component is disposed on the insulation layer, and the insulation layer comprises an encapsulation region and a cutting region;
forming the at least one cutting groove in the encapsulation region of the insulation layer; and
sealing the organic light emitting component with the encapsulation layer, such that the insulation layer and the encapsulation layer are in contact with each other in the encapsulation region, and the at least one cutting groove is disposed in the contact region.

9. The method according to claim 8, wherein the encapsulation layer comprises a first inorganic layer and a second inorganic layer, and an organic buffer layer is disposed between the first inorganic layer and the second inorganic layer.

10. The method according to claim 9, wherein the first inorganic layer is closer to the organic light emitting component than the second inorganic layer, and the first inorganic layer is in contact with the insulation layer in the encapsulation region.

11. The method according to claim 8, wherein the at least one first cutting groove is disposed at a boundary between the encapsulation region and the cutting region of the insulation layer, the encapsulation layer is extended laterally and is terminated in the at least one first cutting groove.

12. The method according to claim 8, wherein the at least one cutting groove further comprises at least one second cutting groove, and a depth of the at least one second cutting groove is smaller than a thickness of the insulation layer.

13. The method according to claim 12, wherein the at least one second cutting groove is disposed at a boundary between the encapsulation region and the cutting region of the insulation layer, the encapsulation layer is extended laterally and is terminated in the at least one second cutting groove.

14. A display device, comprising:
a base substrate;
an insulation layer, disposed on the base substrate;
an organic light emitting component, disposed on the insulation layer; and
an encapsulation layer, configured for sealing the organic light emitting component,
wherein the insulation layer comprises an encapsulation region, the insulation layer and the encapsulation layer are in contact with each other in the encapsulation region, and at least one cutting groove is formed in a contact region,
wherein the at least one cutting groove comprises at least one first cutting groove, and the at least one first cutting groove is a through groove penetrating through the insulation layer and near the organic light emitting component, and
wherein the at least one first cutting groove is disposed at a boundary between the encapsulation region and a cutting region of the insulation layer, the encapsulation layer is extended laterally and is terminated in the at least one first cutting groove.

15. A display device, comprising:
a base substrate;
an insulation layer, disposed on the base substrate;
an organic light emitting component, disposed on the insulation layer; and
an encapsulation layer, configured for sealing the organic light emitting component,
wherein the insulation layer comprises an encapsulation region, the insulation layer and the encapsulation layer are in contact with each other in the encapsulation region, and at least one cutting groove is formed in a contact region,
wherein the at least one cutting groove comprises at least one first cutting groove and at least one second cutting groove, the at least one first cutting groove is a through groove penetrating through the insulation layer and near the organic light emitting component, and a depth of the at least one second cutting groove is smaller than a thickness of the insulation layer.

16. The display device according to claim 15, wherein the at least one second cutting groove is disposed at a boundary between the encapsulation region and a cutting region of the insulation layer, the encapsulation layer is extended laterally and is terminated in the at least one second cutting groove.

* * * * *